(12) United States Patent
San Antonio et al.

(10) Patent No.: US 8,084,300 B1
(45) Date of Patent: Dec. 27, 2011

(54) RF SHIELDING FOR A SINGULATED LAMINATE SEMICONDUCTOR DEVICE PACKAGE

(75) Inventors: Romarico S. San Antonio, San Miguel (PH); Michael H. McKerreghan, Farmers Branch, TX (US); Anang Subagio, Batam Island (ID); Allan C. Toriaga, Asingan (PH); Lenny Christina Gultom, Bekasi Barat (ID)

(73) Assignee: Unisem (Mauritius) Holdings Limited, Port Louis (MU)

( * ) Notice: Subject to any disclaimer, the term of this patent is extended or adjusted under 35 U.S.C. 154(b) by 0 days.

(21) Appl. No.: 12/953,588

(22) Filed: Nov. 24, 2010

(51) Int. Cl.
*H01L 21/82* (2006.01)

(52) U.S. Cl. ............... 438/114; 257/E21.602

(58) Field of Classification Search ......... 438/114; 257/E21.602
See application file for complete search history.

(56) References Cited

U.S. PATENT DOCUMENTS

| | | |
|---|---|---|
| 5,153,704 A | 10/1992 | Onuki et al. |
| 5,166,772 A | 11/1992 | Soldner et al. |
| 5,355,016 A | 10/1994 | Swirbel et al. |
| 5,371,404 A | 12/1994 | Juskey et al. |
| 5,485,037 A | 1/1996 | Marrs |
| 5,486,720 A | 1/1996 | Kierse |
| 5,557,142 A | 9/1996 | Gilmore et al. |
| 5,650,659 A | 7/1997 | Mostafazadeh et al. |
| 5,831,324 A | 11/1998 | Bang |
| 5,866,943 A | 2/1999 | Mertol |
| 5,955,777 A | 9/1999 | Corisis et al. |
| 6,043,557 A | 3/2000 | Phelps, Jr. et al. |
| 6,222,260 B1 | 4/2001 | Liang et al. |
| 6,452,255 B1 | 9/2002 | Bayan et al. |
| 6,455,864 B1 | 9/2002 | Featherby et al. |
| 6,479,886 B1 | 11/2002 | Pollock et al. |
| 6,667,546 B2 | 12/2003 | Huang et al. |
| 6,740,959 B2 | 5/2004 | Alcoe et al. |
| 6,891,273 B2 | 5/2005 | Pu et al. |
| 6,940,154 B2 | 9/2005 | Pedron et al. |
| 7,049,682 B1 | 5/2006 | Mathews et al. |
| 7,342,303 B1 | 3/2008 | Berry et al. |
| 7,408,244 B2 | 8/2008 | Lee et al. |
| 7,451,539 B2 | 11/2008 | Morris et al. |

(Continued)

OTHER PUBLICATIONS

Yasin Zaka, "Overview of Techniques for Applying Conductive Coatings to Plastics for EMI/RFI Shielding," International Conference on Conductive Coatings and Compounds, Jun. 21-22, 1999, Paper 7, pp. 1-10, Brussels, Belgium.

*Primary Examiner* — N Drew Richards
*Assistant Examiner* — Daniel Shook
(74) *Attorney, Agent, or Firm* — Wiggin and Dana LLP

(57) ABSTRACT

A method for manufacturing a semiconductor device package to provide RF shielding. The device is mounted on a laminated substrate having conducting pads on its top surface. A molding compound covers the substrate top surface and encapsulates the devices. The substrate is disposed on a tape; the molding compound and the substrate are cut through, forming package units separated by the saw cut width and exposing a portion of a conducting pad. In an embodiment, the tape is stretched to widen the gap between package units. A conductive shield is applied to cover each package unit and to make electrical contact with the exposed conducting pad portion, thereby connecting to a ground trace beneath the device and providing RF shielding for the device. A single-unit molding process may be used, in which the conducting pad is exposed during and after molding.

25 Claims, 9 Drawing Sheets

U.S. PATENT DOCUMENTS

| | | |
|---|---|---|
| 7,514,789 B1 | 4/2009 | Tao et al. |
| 7,535,084 B2 | 5/2009 | Kim |
| 7,576,415 B2 | 8/2009 | Cha et al. |
| 7,579,672 B2 | 8/2009 | Wu |
| 7,629,674 B1 | 12/2009 | Foster |
| 7,648,858 B2 | 1/2010 | Tang et al. |
| 2005/0067676 A1 | 3/2005 | Mahadevan et al. |
| 2005/0093112 A1 | 5/2005 | Kim |
| 2005/0104164 A1 | 5/2005 | Awujoola et al. |
| 2006/0118924 A1 | 6/2006 | Corisis et al. |
| 2007/0273009 A1 | 11/2007 | Hauenstein |
| 2008/0164583 A1 | 7/2008 | Tien et al. |
| 2008/0272469 A1 | 11/2008 | Kwak et al. |
| 2009/0014847 A1 | 1/2009 | Chen et al. |
| 2009/0065911 A1 | 3/2009 | Wu et al. |
| 2009/0072357 A1 | 3/2009 | Tang et al. |
| 2009/0146269 A1 | 6/2009 | Chow et al. |
| 2009/0152688 A1 | 6/2009 | Do et al. |
| 2009/0166819 A1 | 7/2009 | Chen et al. |
| 2009/0184403 A1 | 7/2009 | Wang et al. |
| 2009/0194851 A1* | 8/2009 | Chiu et al. ............... 257/660 |
| 2009/0206455 A1 | 8/2009 | Harper et al. |
| 2009/0212401 A1 | 8/2009 | Do et al. |
| 2009/0289335 A1 | 11/2009 | Camacho et al. |
| 2009/0294928 A1 | 12/2009 | Kim et al. |
| 2009/0294930 A1* | 12/2009 | Yoon et al. ............... 257/660 |
| 2009/0302435 A1 | 12/2009 | Pagaila et al. |
| 2009/0302436 A1 | 12/2009 | Kim et al. |
| 2009/0302437 A1 | 12/2009 | Kim et al. |
| 2009/0302438 A1 | 12/2009 | Chauhan et al. |
| 2010/0006987 A1 | 1/2010 | Murugan et al. |
| 2010/0006988 A1 | 1/2010 | Tang et al. |
| 2010/0007029 A1* | 1/2010 | Do et al. ............... 257/774 |
| 2010/0032814 A1 | 2/2010 | Cho et al. |
| 2010/0044840 A1 | 2/2010 | Tang et al. |
| 2010/0072582 A1 | 3/2010 | Chandra et al. |
| 2010/0127360 A1 | 5/2010 | Pagaila et al. |

* cited by examiner

RF SHIELDING FOR A SINGULATED LAMINATE SEMICONDUCTOR DEVICE PACKAGE

FIELD OF THE DISCLOSURE

This disclosure relates to packages for semiconductor devices. More particularly, the disclosure relates to providing shielding for singulated laminate semiconductor device packages against radio-frequency (RF) electromagnetic interference (EMI).

BACKGROUND OF THE DISCLOSURE

Radio-frequency (RF) shielding is often required for semiconductor devices, to protect the device from electromagnetic interference (EMI) which degrades device performance. In semiconductor device packages where the device is attached to a multilayer substrate, the substrate generally includes insulating layers and conducting layers. The conducting layers are typically copper wiring layers including a plurality of conductive traces. Effective RF shielding requires that a shield covering the top of the device (e.g. a conformal metal coating) make electrical connection to a trace providing shielding beneath the device. This in turn generally requires cutting into the package and partially through the substrate to expose the trace intended to connect with the conductive coating. Since a typical trace is a layer of copper with a thickness of only about 18 µm, this cutting process has a narrow process window; controlling the depth of the cut may add time and cost to the overall manufacturing process.

In addition, shielding the sides of a package generally requires that the packages be at least partially singulated (laterally separated from each other). It is desirable, however, to apply the shielding to an array of packages, as opposed to one package at a time. The process for applying the shielding is preferably completed prior to full singulation.

It therefore is desirable to implement a process for RF shielding of laminated packages which has a wide process window and results in a fully shielded, singulated package.

SUMMARY OF THE DISCLOSURE

In accordance with an aspect of the disclosure, there is provided a method for manufacturing a semiconductor device package to provide RF shielding for the device. The device is mounted on a laminated substrate having conducting pads on its top surface. A block molding process is used to apply a molding compound to the substrate and to the semiconductor devices, thereby covering the top surface of the substrate and encapsulating the semiconductor devices. The bottom surface of the substrate is contacted to a holding surface (e.g. a tape). Both the molding compound and the substrate are cut through, forming a plurality of package units on the holding surface. Each package unit has an upper surface, side surfaces, a semiconductor device, and a conducting pad portion exposed at a side surface; neighboring package units have a first gap therebetween. The package units are then disposed on a final surface (a tape or jig) where neighboring package units have a second gap therebetween, wider than the first gap. In an embodiment, the package units are formed on a tape, and the tape is stretched to widen the gap between package units. A conductive shield is then applied to the package units, so that the conductive shield covers each package unit at the upper and side surfaces thereof and covers portions of the final surface adjacent to the side surfaces, thereby making electrical contact with the exposed conducting pad portion. The package units are then removed from the final surface to form singulated packages. At least one of the conducting layers in the laminated substrate is a ground trace beneath the devices. The conductive shield covering the device makes electrical contact with the ground trace, thereby providing RF shielding for the device.

In accordance with another aspect of the disclosure, the molding process is a single-unit molding process, so that a portion of a conducting pad at a boundary between package units remains exposed during and after molding. A conductive shield is applied to the molding compound and to the exposed conducting pad portion, so that the conductive shield makes electrical contact with the conducting pad portion, and thus with a ground trace beneath the devices. The package units are then separated by sawing or punching along the boundary to form singulated packages. The connected conductive shield and ground trace in each package surround the device and are effective to provide RF shielding for the device.

Details of various embodiments of the invention are set forth in the accompanying drawings and the description below. Other features, objects and advantages of the invention will be apparent from the description and drawings, and from the claims.

DETAILED DESCRIPTION

Methods for providing RF shielding for block-molded and pocket-molded laminated device packages are detailed below.

Figure 1:
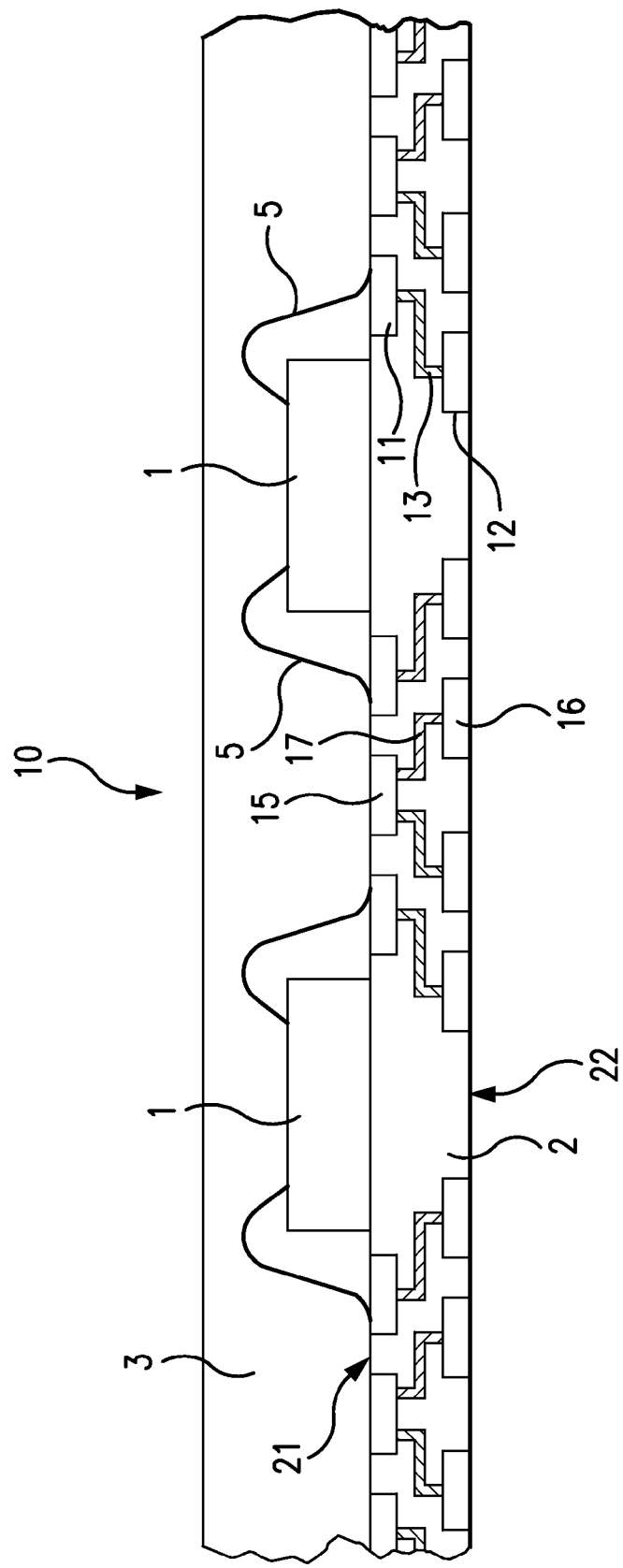
FIG. 1 schematically illustrates in cross-section view a plurality of laminated semiconductor packages with block molding, prior to singulation.

FIG. 1 illustrates an array 10 of laminated semiconductor device packages before application of RF shielding and before singulation. Each device 1 is attached to a laminated substrate 2. As shown schematically in FIG. 1, substrate 2 has electrically conducting pads on its top surface (first surface) 21 and its bottom surface (second surface) 22 respectively. Substrate 2 includes a plurality of conducting and insulating layers with interior connections between the conducting layers, so that the pads on the two surfaces are connected by numerous conducting paths. In this embodiment, device 1 is connected to pads 11 by wirebond connections 5; in other embodiments, the device may be connected to the substrate in a flip-chip arrangement. Pads 11 are connected to pads 12 on the bottom side of the substrate by conducting paths 13. The package may also include passive components connected to the device and/or to the substrate.

Furthermore, in this embodiment pads 15 on surface 21, not connected to device 1, are connected to pads 16 on surface 22 by paths 17. At least one path 17 advantageously connects to a conducting ground trace (not shown) underlying the device 1. Since the trace is connected to pad 15, exposing a portion of pad 15 permits connection of the trace to an RF shield. In other embodiments, one or more of pads 15 may be connected to the device 1 as well as to pads 16.

A layer 3 of molding material (e.g. polymer resin) covers the devices, the bonding wires, and any area of the substrate surface 21 not covered by the devices, as shown in FIG. 1. In this embodiment, layer 3 is formed by block molding, so that singulating the packages requires breaking the layer apart (by sawing, punching, etc.) at the boundaries between packages.

Figure 2:
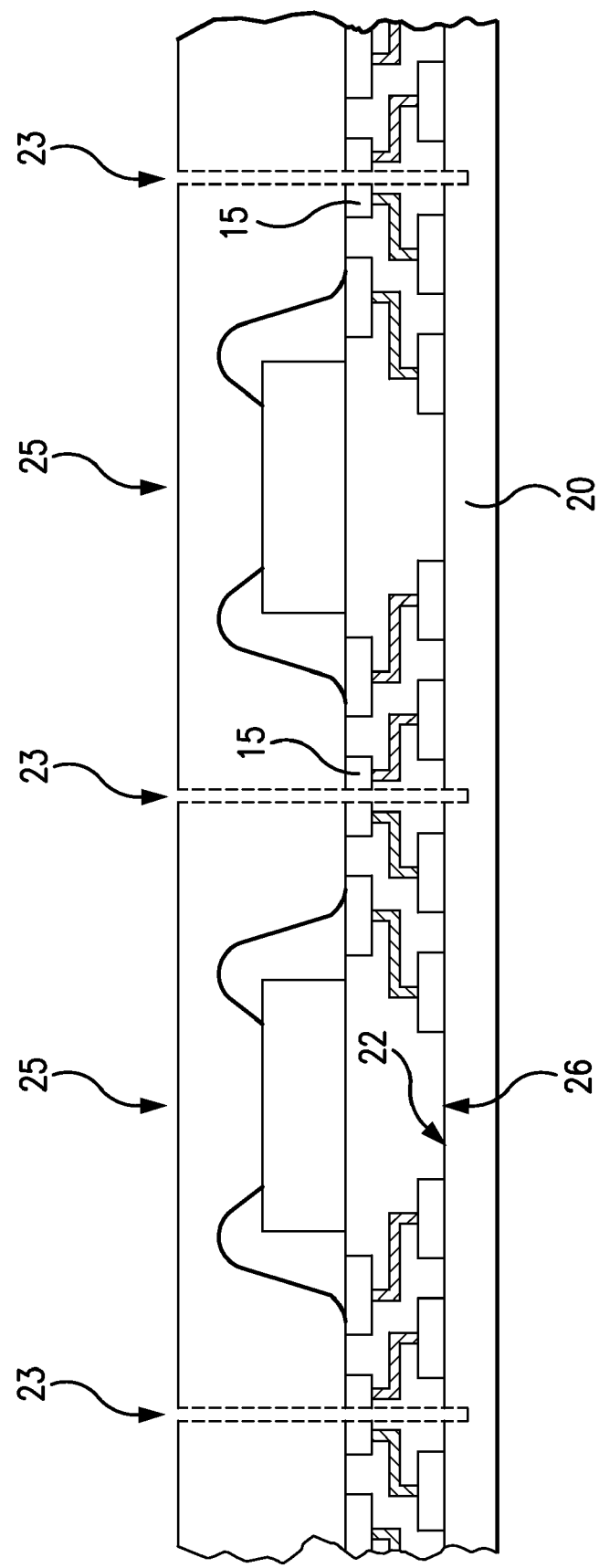
FIG. 2 illustrates a full cut through the molding and substrate at the boundaries of the packages of FIG. 1 to separate the packages, in accordance with an embodiment of the disclosure.

A process of cutting through the molding and the substrate is illustrated in FIG. 2. In this embodiment, package array 10 is mounted on a tape 20 with the top surface 26 of the tape (characterized as a holding surface) contacting the bottom surface 22 of the substrate. A saw cut 23 is then made through molding layer 3 and substrate 2, with the bottom of the saw cut in tape 20. The array 10 is thus separated into individual package units 25, with the units connected by tape 20. The saw cut is aligned with pad 15, and the saw has a lateral dimension (width) smaller than that of pad 15, so that a portion of pad 15 is exposed at the cut side surface 27 of substrate 2 for each package unit 25.

Figure 3:
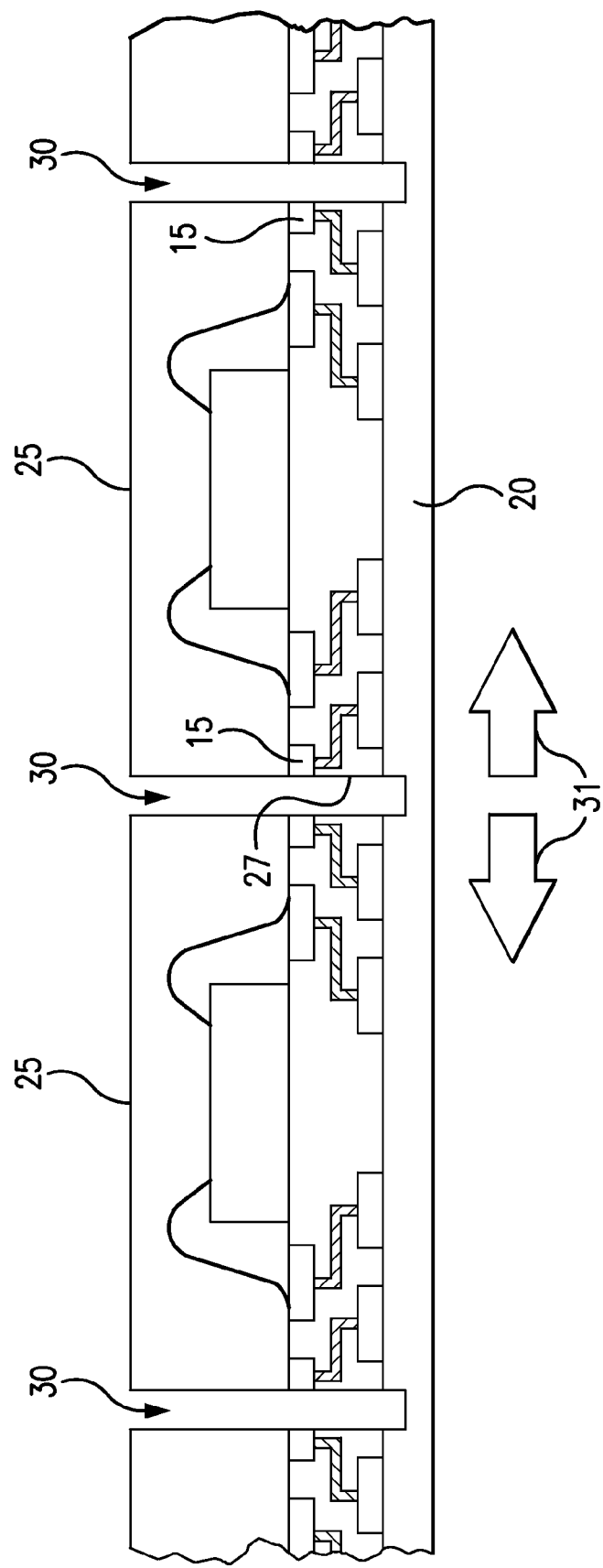
FIG. 3 illustrates further separation of the packages of FIG. 2, in accordance with an embodiment of the disclosure.

The tape is then stretched (see FIG. 3), in one or both directions 31, thereby pulling apart package units 25 to make wider spaces 30 between them. As shown in FIG. 3, directions 31 are generally transverse to the cutting direction along the boundary between neighboring package units. Tape 20 is advantageously stretched so that each space 30 has a width approximately equal to the package thickness (that is, a cross section of the space between package units has an aspect ratio of about 1.0).

Figure 4:
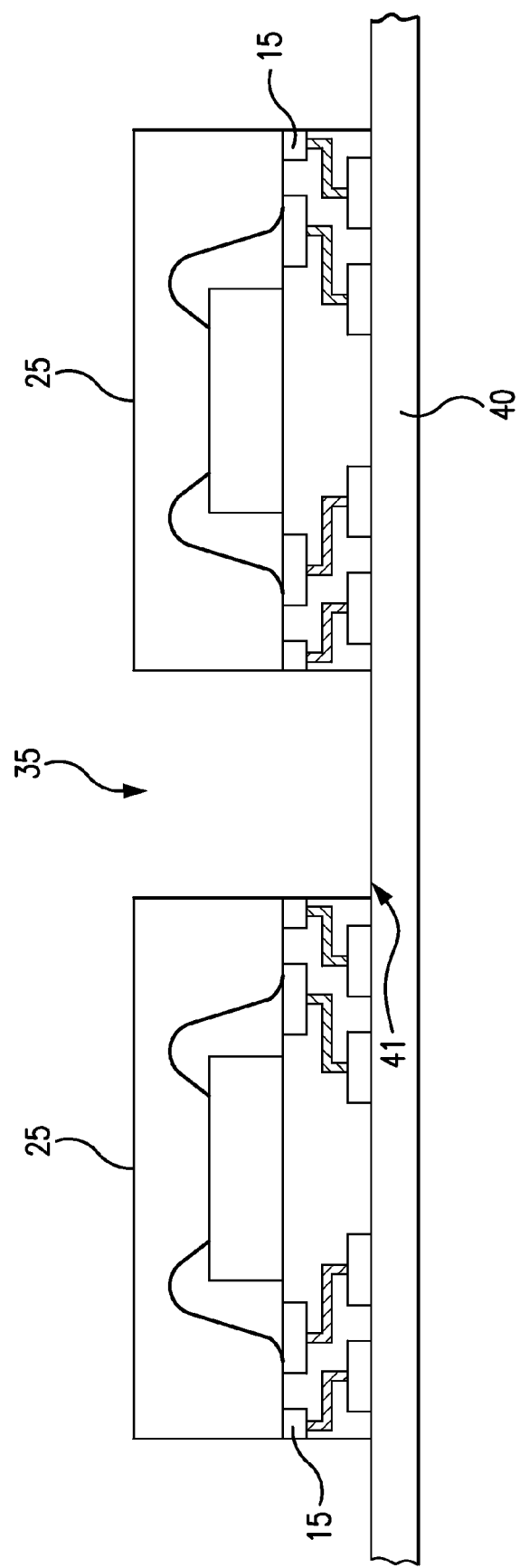
FIG. 4 illustrates placement of the separated packages of FIG. 2, in accordance with another embodiment of the disclosure.

Alternatively, a jig or carrier may be used in the cutting process instead of a tape, with the saw cut extending partially into the jig; the separate package units 25 are subsequently moved in a pick-and-place operation to a second jig or tape 40, as shown in FIG. 4. Package units 25 are thus disposed on surface 41 of jig/tape 40 (characterized as a final surface). If the first tape 20 in FIG. 2 is not stretched, then the separate package units 25 are moved to second tape or jig 40 by a pick-and-place operation so that package units 25 have space between them as desired (see FIG. 4). Package units 25 thus may remain on stretched tape 20 (in which case the holding surface 26 becomes the final surface due to the stretching) or have a pick-and-place operation performed to move them to the second tape or jig 40; in either case, the space between neighboring package units is increased from the width of saw cut 23 to a width approximating the height of the package units.

The mold surface and the exposed sides of the substrate (including the exposed copper trace) are then pre-cleaned, in either a dry (plasma) or wet (chemical dipping) process. A conductive shield layer 51 is then applied (FIG. 5), covering the top and sides of each package unit and making an electrical connection to the exposed trace (in this embodiment, the exposed side of pad 15). Layer 51 may be applied by any of a variety of processes, e.g. spraying, screen printing, scraping, dipping, spinning, immersion, electroplating, etc. Layer 51 may include copper, silver, nickel, lead, tin, or a combination thereof. When layer 51 is deposited by plating, the pre-cleaning process (e.g. a chemical cleaning process) also serves to prepare and activate the surface to be plated.

Figure 5:
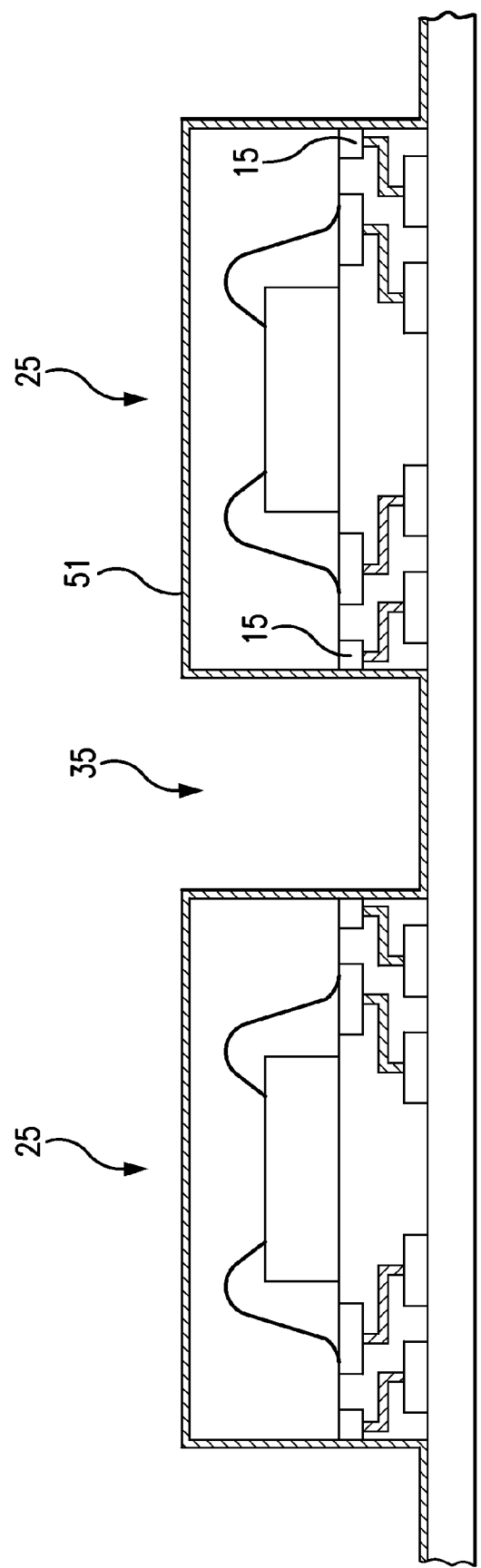
FIG. 5 illustrates a conductive shield applied to laminated packages, in accordance with embodiments of the disclosure.

Spaces 30, 35 between neighboring package units 25 are made wide enough to permit effective cleaning between the package units and coverage of the sides of each package unit by shield layer 51. As with space 30 on stretched tape 20, the width of space 35 after a pick-and-place operation is typically about the same as the package thickness (that is, the cross section of the space between units has an aspect ratio of about 1.0), as shown in FIG. 5.

Figure 6:
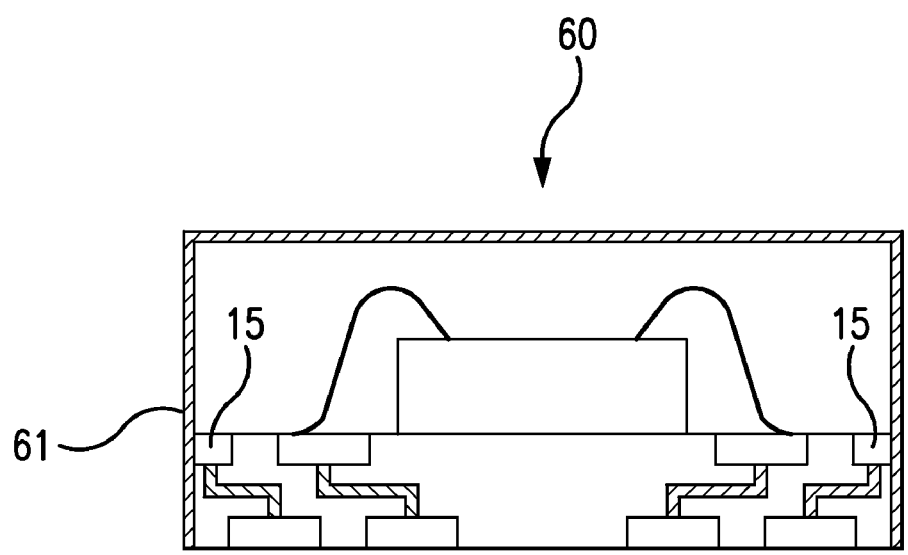
FIG. 6 illustrates a finished RF shielded laminated package with block molding, after final singulation.

The tape/jig is then separated from the substrate to yield a finished, laminated, singulated package 60 having RF shielding 61 on the top and sides of the package, where the shielding 61 connects to at least one trace for providing RF shielding beneath the device (see FIG. 6).

Figure 7:
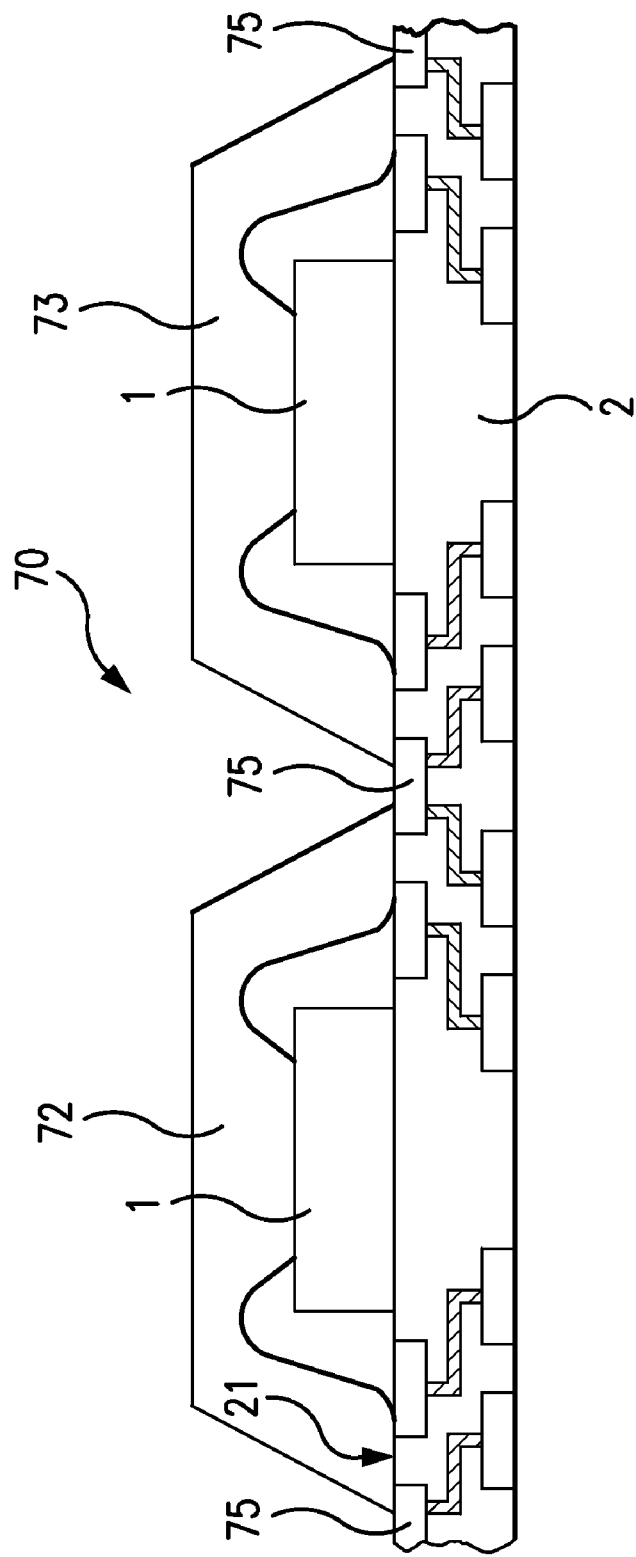
FIG. 7 schematically illustrates in cross-section view a plurality of laminated semiconductor packages with pocket molding, prior to singulation.

According to a further embodiment of the disclosure, RF shielding may be provided for packages having single-unit molding (sometimes called pocket molding). FIG. 7 illustrates an array 70 of laminated semiconductor packages with devices 1 connected to substrate 2 as described previously, and where layers 72, 73 of the molding compound cover each device separately. The single-unit molding process uses a mold clamp which occupies a mold clamping area on the surface 21 of substrate 2, as is understood by those skilled in the art. The mold clamping area of the substrate remains exposed after the molding process; accordingly, an area 75 (comprising a portion of the trace beneath the device) is exposed, as shown in FIG. 7. In this embodiment, the metal trace is comprised of copper.

Figure 8:
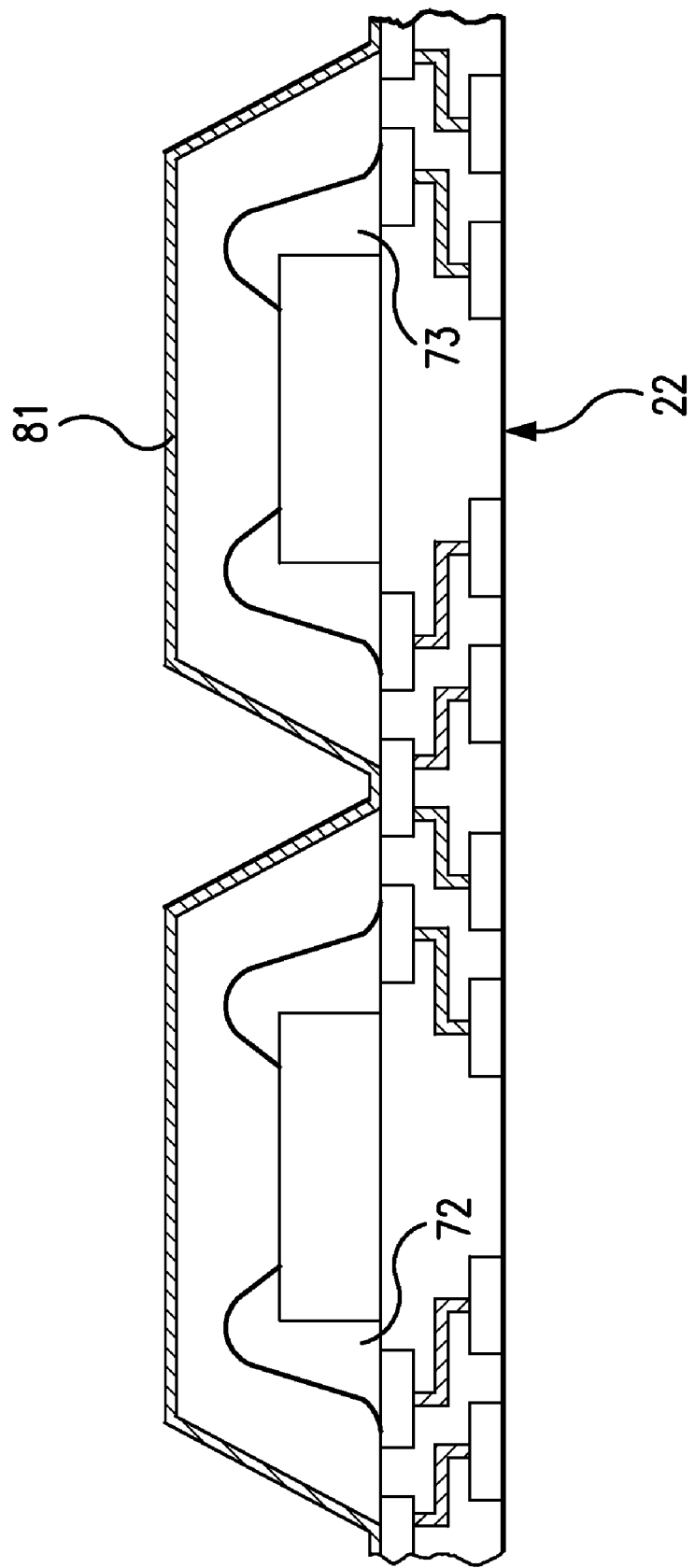
FIG. 8 illustrates a conductive shield applied to the laminated packages of FIG. 7, in accordance with further embodiments of the disclosure.

A plasma cleaning process or chemical cleaning process may be used to clean the exposed copper. A conductive shield layer 81 is then applied (FIG. 8), covering the top and sides of separate moldings 72, 73 and making an electrical connection to the exposed area 75 of the copper trace. Layer 81 may be a conductive ink, a conductive paint, etc., and may be applied by any of a variety of processes, e.g. spraying, screen printing, scraping, dipping, spinning, immersion, electroplating, etc. Layer 81 may include copper, silver, nickel, lead, tin, or a combination thereof. When layer 81 is deposited by plating, the cleaning process (e.g. a chemical cleaning process) also serves to prepare and activate the surface to be plated. A protective layer (a tape or coating) may optionally be applied on the bottom side 22 of the substrate to prevent contamination; this layer may be removed before singulation of the packages.

Figure 9:
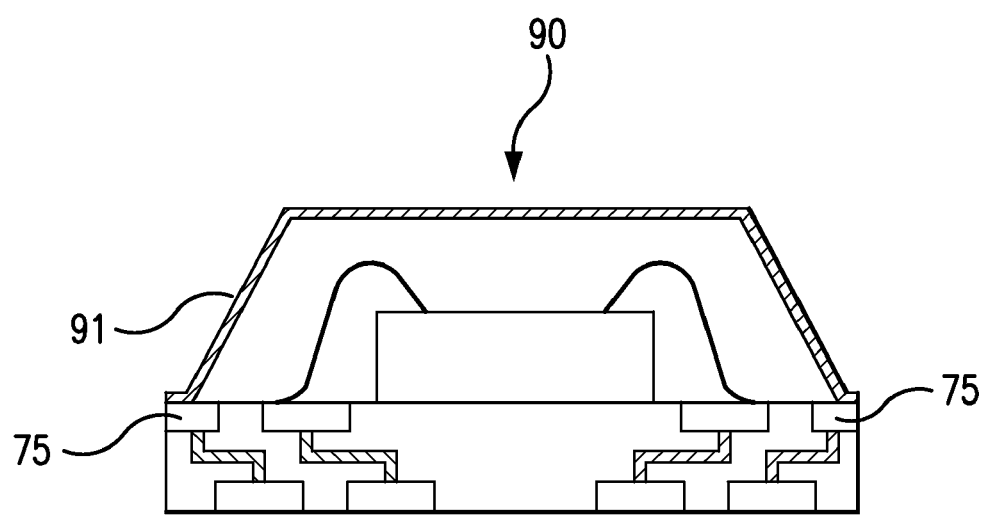
FIG. 9 illustrates a finished RF shielded laminated package with pocket molding, after final singulation.

A singulation process is then performed, in which the packages in array 70 are separated from each other by sawing, punching, etc. For each package unit, the singulation process yields a finished, laminated package 90 having RF shielding 91 on the top and sides of the package, where the shielding 91 connects to at least one exposed portion 75 of the metal trace providing RF shielding beneath the device (see FIG. 9).

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:
1. A method for manufacturing a semiconductor package, comprising:
preparing a substrate having an interior, a top surface and an opposing bottom surface, including forming conducting paths in the interior of the substrate, and forming conducting pads on the top surface and on the bottom surface, aligned with respective ends of said conducting paths and in electrical contact therewith;

mounting semiconductor devices on the top surface;

applying a molding compound to the substrate and to the semiconductor devices, thereby covering the top surface and encapsulating the semiconductor devices;

contacting the bottom surface to a holding surface;

cutting through the molding compound, the substrate, and the holding surface, thereby forming a plurality of package units each having an upper surface, side surfaces, a semiconductor device, and a conducting pad portion exposed at a side surface, neighboring package units having a first gap therebetween with a first width;

causing the package units to be disposed on a final surface so that neighboring package units have a second gap therebetween with a second width greater than the first width, thereby permitting coverage of said side surfaces by a conductive shield layer, and wherein the second width is approximately equal to a height of a package unit;

subsequently applying the conductive shield layer to the package units, to form a conductive shield covering each package unit at the upper surface and the side surfaces thereof and covering portions of the final surface adjacent to the side surfaces, thereby making electrical contact with said exposed conducting pad portion, neighboring shielded package units being separated by a gap having a width approximately equal to a height of a package unit; and removing the package units from the final surface to form singulated packages.

2. A method according to claim 1, wherein in said contacting step the holding surface is a top surface of a tape, and further comprising stretching said tape after said cutting step to increase a gap width between neighboring package units from the first width to the second width, thereby providing the final surface with the package units disposed thereon.

3. A method according to claim 2, wherein said stretching is performed in a direction transverse to a cutting direction along a boundary between the package units.

4. A method according to claim 1, wherein in said contacting step the holding surface is a top surface of a jig, and further comprising performing a pick-and-place operation after said cutting step to dispose the package units on a tape, so that a top surface of said tape is the final surface.

5. A method according to claim 1, wherein in said contacting step the holding surface is a top surface of a first tape, and further comprising performing a pick-and-place operation after said cutting step to dispose the package units on a second tape, so that a top surface of said second tape is the final surface.

6. A method according to claim 1, wherein in said contacting step the holding surface is a top surface of a first jig, and further comprising performing a pick-and-place operation after said cutting step to dispose the package units on a second jig, so that a top surface of said second jig is the final surface.

7. A method according to claim 1, wherein in said contacting step the holding surface is a top surface of a tape, and further comprising performing a pick-and-place operation after said cutting step to dispose the package units on a jig, so that a top surface of said jig is the final surface.

8. A method according to claim 1, wherein in said step of causing the package units to be disposed on the final surface, the second width permits effective cleaning between the package units, and further comprising cleaning a surface of the molding compound and the exposed conducting pad portion before applying the conductive shield.

9. A method according to claim 8, wherein the cleaning comprises at least one of a plasma cleaning process and a chemical cleaning process.

10. A method according to claim 1, wherein said cutting step is performed using a saw, so that the first width is a saw cut width.

11. A method according to claim 1, wherein said step of applying a molding compound comprises performing a block molding process.

12. A method according to claim 1, wherein the conductive shield includes one or more of copper, silver, nickel, lead, tin, and combinations thereof.

13. A method according to claim 1, wherein said step of applying a conductive shield includes
one or more of spraying, screen printing, scraping, dipping, spinning, immersion, and electroplating.

14. A method according to claim 1, wherein the substrate is a laminated substrate including a plurality of conducting layers and a plurality of insulating layers.

15. A method according to claim 14, wherein
in each package unit at least one of said conducting layers is a ground trace beneath the device thereof, and
the conductive shield makes electrical contact with said ground trace, thereby providing RF shielding for the device.

16. A method for manufacturing a semiconductor package, comprising:
preparing a substrate having an interior, a top surface and an opposing bottom surface, including
forming conducting paths in the interior of the substrate, and
forming conducting pads on the top surface and on the bottom surface, aligned with respective ends of said conducting paths and in electrical contact therewith;
mounting semiconductor devices on the top surface;
applying a molding compound to the substrate and to the semiconductor devices, so that the molding compound covers the devices while leaving exposed a portion of the top surface of the substrate including at least a top surface portion of a conducting pad, where said exposed conducting pad top surface portion is disposed at a boundary between package units each having a semiconductor device;
applying a conductive shield to the molding compound and to the exposed portion of the top surface of the substrate, so that the conductive shield makes electrical contact with said exposed conducting pad top surface portion; and
subsequently separating the package units along said boundary to form singulated packages.

17. A method according to claim 16, wherein said step of applying a molding compound comprises performing a single-unit molding process.

18. A method according to claim 16, wherein said separating step includes at least one of a sawing process and a punching process.

19. A method according to claim 16, further comprising cleaning a surface of the molding compound and the exposed conducting pad portion before applying the conductive shield.

20. A method according to claim 19, wherein the cleaning comprises at least one of a plasma cleaning process and a chemical cleaning process.

21. A method according to claim 16, further comprising applying a protective layer to the bottom surface of the substrate before said step of applying the conductive shield, the protective layer including at least one of a tape and a coating.

22. A method according to claim 16, wherein the conductive shield includes one or more of copper, silver, nickel, lead, tin, and combinations thereof.

23. A method according to claim 16, wherein said step of applying a conductive shield includes
one or more of spraying, screen printing, scraping, dipping, spinning, immersion, and electroplating.

24. A method according to claim 16, wherein the substrate is a laminated substrate including a plurality of conducting layers and a plurality of insulating layers.

25. A method according to claim 24, wherein
in each package unit at least one of said conducting layers is a ground trace beneath the device thereof, and
the conductive shield makes electrical contact with said ground trace, thereby providing RF shielding for the device.

* * * * *